(12) United States Patent
Kim

(10) Patent No.: US 8,305,707 B2
(45) Date of Patent: Nov. 6, 2012

(54) COUPLING STRUCTURE USING STUD

(75) Inventor: Yu-sung Kim, Seoul (KR)

(73) Assignee: Seagate Technology International, Scotts Valley, CA (US)

( * ) Notice: Subject to any disclaimer, the term of this patent is extended or adjusted under 35 U.S.C. 154(b) by 1127 days.

(21) Appl. No.: 12/186,665

(22) Filed: Aug. 6, 2008

(65) Prior Publication Data
US 2009/0073842 A1   Mar. 19, 2009

(30) Foreign Application Priority Data

Sep. 17, 2007   (KR) .......................... 10-2007-0094191

(51) Int. Cl.
*G11B 33/14* (2006.01)
(52) U.S. Cl. .................................... 360/97.16
(58) Field of Classification Search .... 360/97.01–97.04, 360/97.12, 97.13, 97.14, 97.15, 97.16, 97.21, 360/97.22
See application file for complete search history.

(56) References Cited

U.S. PATENT DOCUMENTS

| | | | |
|---|---|---|---|
| 6,466,400 B1 * | 10/2002 | Iwahara et al. | 360/99.08 |
| 6,519,110 B2 * | 2/2003 | Dague et al. | 360/99.17 |
| 6,583,949 B2 * | 6/2003 | Maiers | 360/99.18 |
| 6,680,813 B2 * | 1/2004 | Dague et al. | 360/99.16 |
| 7,428,122 B2 * | 9/2008 | Kimura et al. | 360/99.21 |
| 2002/0054453 A1 * | 5/2002 | Alan | 360/97.01 |
| 2005/0174682 A1 * | 8/2005 | Yoo | 360/97.01 |
| 2005/0259352 A1 * | 11/2005 | LeClair et al. | 360/97.02 |
| 2008/0310277 A1 * | 12/2008 | Iwase | 369/75.11 |

* cited by examiner

*Primary Examiner* — Allen Cao

(57) ABSTRACT

A coupling structure of a hard disk drive using a stud. The coupling structure includes a stud insertion hole formed in the base plate, a stud, a first screw insert hole, a first screw, a second screw insert hole, and a second screw. The stud includes a first screw coupling hole formed in an upper portion and a second screw coupling hole formed in a lower portion, and is inserted into the stud insertion hole to be fixed to the base plate. The first screw insert hole is formed at a position of the cover plate disposed over the base plate corresponding to the stud. The first screw is inserted into the first screw insert hole to be coupled to the first screw coupling hole so that the cover plate is coupled to the base plate. The second screw insert hole is formed at a position of the PCB disposed under the base plate corresponding to the stud. The second screw is inserted into the second screw hole to be coupled to the second screw coupling hole so that the PCB is coupled to the base plate. A protective cover is disposed under the base plate to cover and protect the PCB. The protective cover is also coupled to the base plate by the second screw coupled to the second screw coupling hole of the stud.

16 Claims, 3 Drawing Sheets

COUPLING STRUCTURE USING STUD

CROSS-REFERENCE TO RELATED APPLICATIONS

This application claims the benefit of Korean Patent Application No. 10-2007-0094191, filed on Sep. 17, 2007, in the Korean Intellectual Property Office, the disclosure of which is incorporated herein in its entirety by reference.

BACKGROUND OF THE INVENTION

1. Field of the Invention

The present general inventive concept relates to a hard disk drive, and more particularly, to a structure of coupling a cover plate and a printed circuit board to a base plate of a hard disk drive using a stud.

2. Description of the Related Art

A hard disk drive (HDD), which is a data storage device, records data on a disk or reproduces data stored in the disk using a read/write head. For this purpose, the read/write head moves to a desired position by an actuator in the state of floating at a predetermined height from a recording surface of a rotating disk.

Recently, as a portable electronic apparatus such as a portable multimedia player (PMP), a personal digital assistant (PDA), a camcorder, an MP3 player, or a navigation device has a high speed and capacity, the portable electronic apparatus has employed a hard disk drive capable of storing a larger amount of data. However, the portable electronic apparatus needs to have slim and lightweight properties for enhancing the portability as well as the high speed and capacity. Therefore, a small-sized disk drive that uses a disk with a very small diameter, for example, ranging from 1.8 inches, 1.3 inches, 1 inch, or 0.85 inches, is employed in the portable electronic apparatus.

FIG. 1 is a cross-sectional view illustrating a coupling structure of a conventional hard disk drive.

Referring to FIG. 1, a hard disk drive 10 includes a disk, a spindle motor rotating the disk, a read/write head, and an actuator, which are surrounded with and protected by a base 11 and a cover 12. The actuator moves the read/write head to a desired position over the disk. The cover 12 is coupled to an upper surface of the base 11 through a first screw 21, and a printed circuit board (PCB) 13 and a protective cover 14 are coupled to a lower surface of the base 11 through a second screw 31.

In order to reduce the size and thickness of the small-sized hard disk drive 10 as much as possible, the base 11 and the cover 12 are fabricated by pressing a thin metal plate. Therefore, first and second studs 22 and 32 having screw holes 23 and 33, respectively, are used in order to couple the first and second screws 21 and 31 to the base 11. The first stud 22 is pressed and fixed to a first insertion hole 24 formed in the base 11, and the second stud 32 is pressed and fixed to a second insertion hole 34 adjacent to the first pressing hole 24.

As described above, in the conventional hard disk drive 10, the first stud 22 for coupling the cover 12 to the base 11 and the second stud 32 for coupling the PCB 13 to the base 11 are separately used, thus increasing the fabrication cost. In addition, the first and second studs 22 and 32 mounted in the respective coupling positions of the base 11 occupy a large space.

SUMMARY OF THE INVENTION

The present general inventive concept provides a coupling structure of a hard disk drive that can couple a cover plate and a PCB to a respective coupling position of a base plate using one stud.

Additional aspects and utilities of the present general inventive concept will be set forth in part in the description which follows and, in part, will be obvious from the description, or may be learned by practice of the general inventive concept.

The foregoing and/or other aspects and utilities of the present general inventive concept are achieved by providing a coupling structure of a hard disk drive of coupling a cover plate and a printed circuit board (PCB) to a base plate of the hard disk drive, including: a stud insertion hole formed in the base plate; a stud including a first screw coupling hole formed in an upper portion and a second screw coupling hole formed in a lower portion, the stud being inserted into the stud insertion hole to be fixed to the base plate, a first screw insert hole formed at a position of the cover plate disposed over the base plate corresponding to the stud; a first screw inserted into the first screw insert hole to be coupled to the first screw coupling hole so that the cover plate is coupled to the base plate; a second screw insert hole formed at a position of the PCB disposed under the base plate corresponding to the stud; a second screw inserted into the second screw hole to be coupled to the second screw coupling hole so that the PCB is coupled to the base plate.

Center lines of the first screw coupling hole and the second screw coupling hole may correspond to a center line of the stud. A partition may be formed between the first and second screw coupling holes.

A first recess may be formed around the first screw insert hole of the cover plate, and a head portion of the first screw may be inserted into the first recess. In this case, a sealing tape may be formed on an outer surface of the cover plate so as to cover the first recess.

A protective cover may be disposed under the base plate to cover and protect the PCB, a second screw insert hole may be formed at a position of the protective cover corresponding to the stud, and the second screw may be inserted into the second screw insert hole formed in the protective cover and the second screw insert hole formed in the PCB to be coupled to the second screw coupling hole of the stud so that the protective cover and the PCB are coupled together to the base plate.

A second recess may be formed around the second screw insert hole of the protective cover and a head portion of the second screw may be inserted into the second recess.

The stud may be formed of stainless steel.

The foregoing and/or other aspects and utilities of the present general inventive concept can also be achieved by providing a coupling structure of a hard disk drive, including: a cover plate including at least one first recession having a first insertion hole to receive a screw; a base plate including at least one stud insertion hole; a stud including a first screw coupling hole formed in an upper portion to align with the first insertion hole and a second screw coupling hole formed in a stepped lower portion thereof to align with and partially extend through the stud insertion hole to be fastened to the base plate; and a printed circuit board (PCB) disposed below the base plate and having a second insertion hole to align with the first insertion hole and the stud insertion hole such that when a first screw is inserted into the first insertion hole and a second screw is inserted into the second insertion hole, a center of the first and second screws align along a same axis.

The coupling structure may further include a protective cover to extend along a length of an outer side of the PCB to protect the PCB, the protective cover including a second recession having a third insertion hole formed therein to receive the second screw before the second insertion hole receives the second screw such that the second screw secures both the PCB and the protective cover to the stepped lower portion of the stud.

The first and second recessions can be formed to a depth such that first and second screws inserted therein, respectively, remain below the surface of the cover plate and the protective cover, respectively.

The first screw insertion hole, the stud insertion hole and the second screw insertion hole can have a common central axis.

The first screw insertion hole and the second screw insertion hole can have a common axis and can be separated from each other by a partition portion of the stud.

The foregoing and/or other aspects and utilities of the present general inventive concept can also be achieved by providing a stud device usable to assemble a storage device, including: a first side including a first screw insertion hole to receive a first screw to fasten a cover plate to the stud; and a second side opposite the first side, the second side including: a stepped portion to be frictionally inserted into a base plate of the storage device to connect the cover plate to the base plate, and a second screw insertion hole to receive a second screw to fasten a printed circuit board to the stud and adjacent to the base plate.

BRIEF DESCRIPTION OF THE DRAWINGS

The above and other features and utilities of the present general inventive concept will become more apparent by describing in detail exemplary embodiments thereof with reference to the attached drawings in which.

DETAILED DESCRIPTION OF THE PREFERRED EMBODIMENTS

Figure 1:
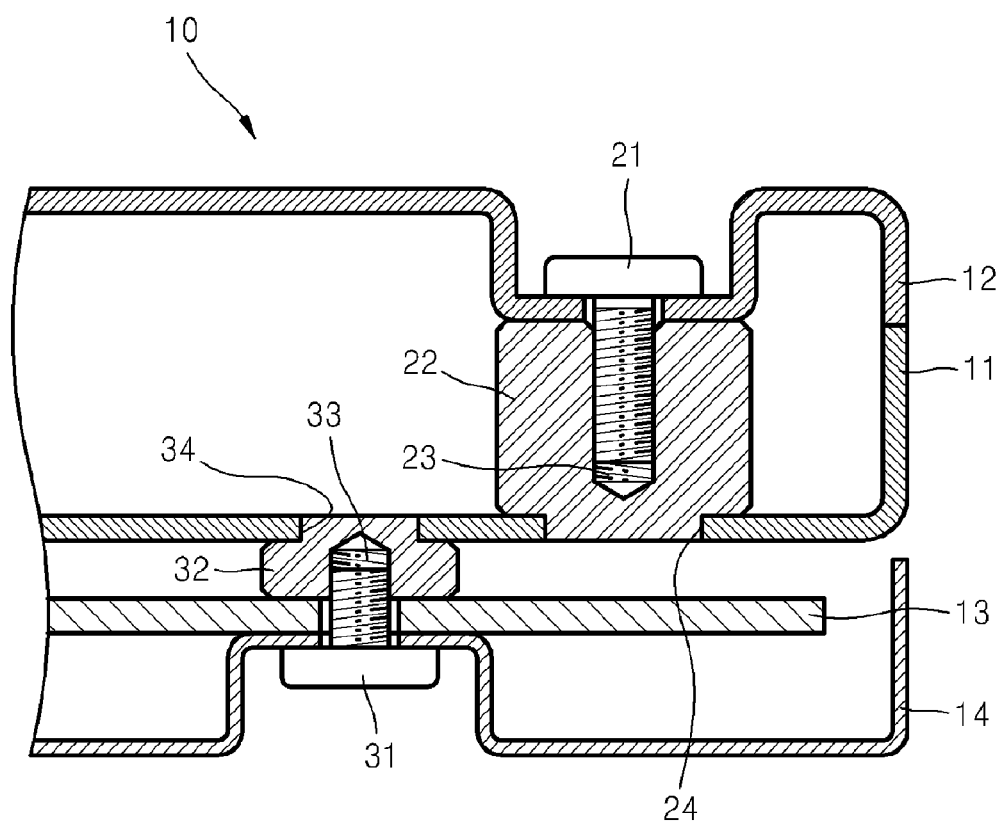
FIG. 1 is a cross-sectional view illustrating a coupling structure of a conventional hard disk drive.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

Figure 2:
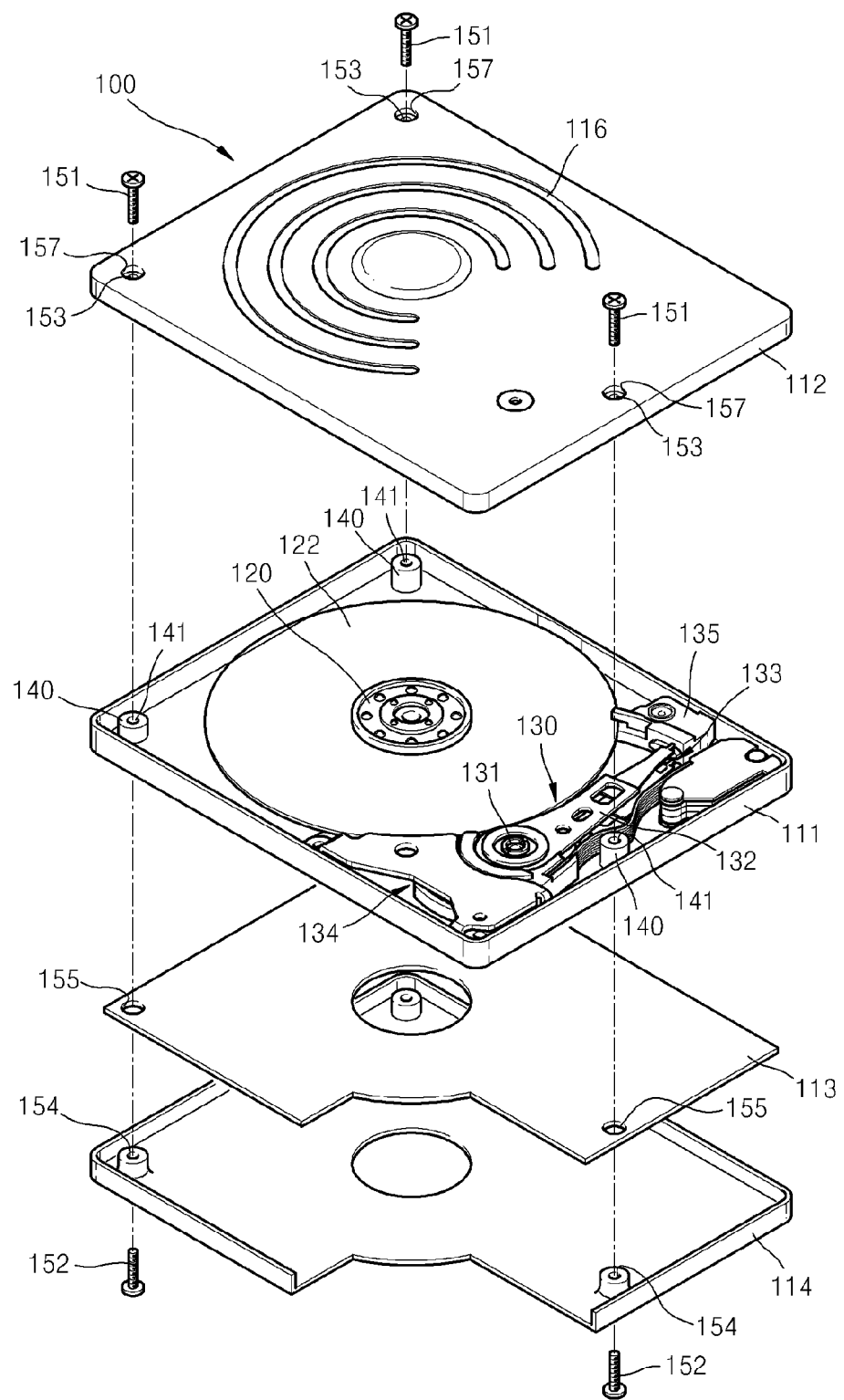
FIG. 2 is an exploded perspective view illustrating a coupling structure of a hard disk drive according to an embodiment of the present general inventive concept.
Figure 3:
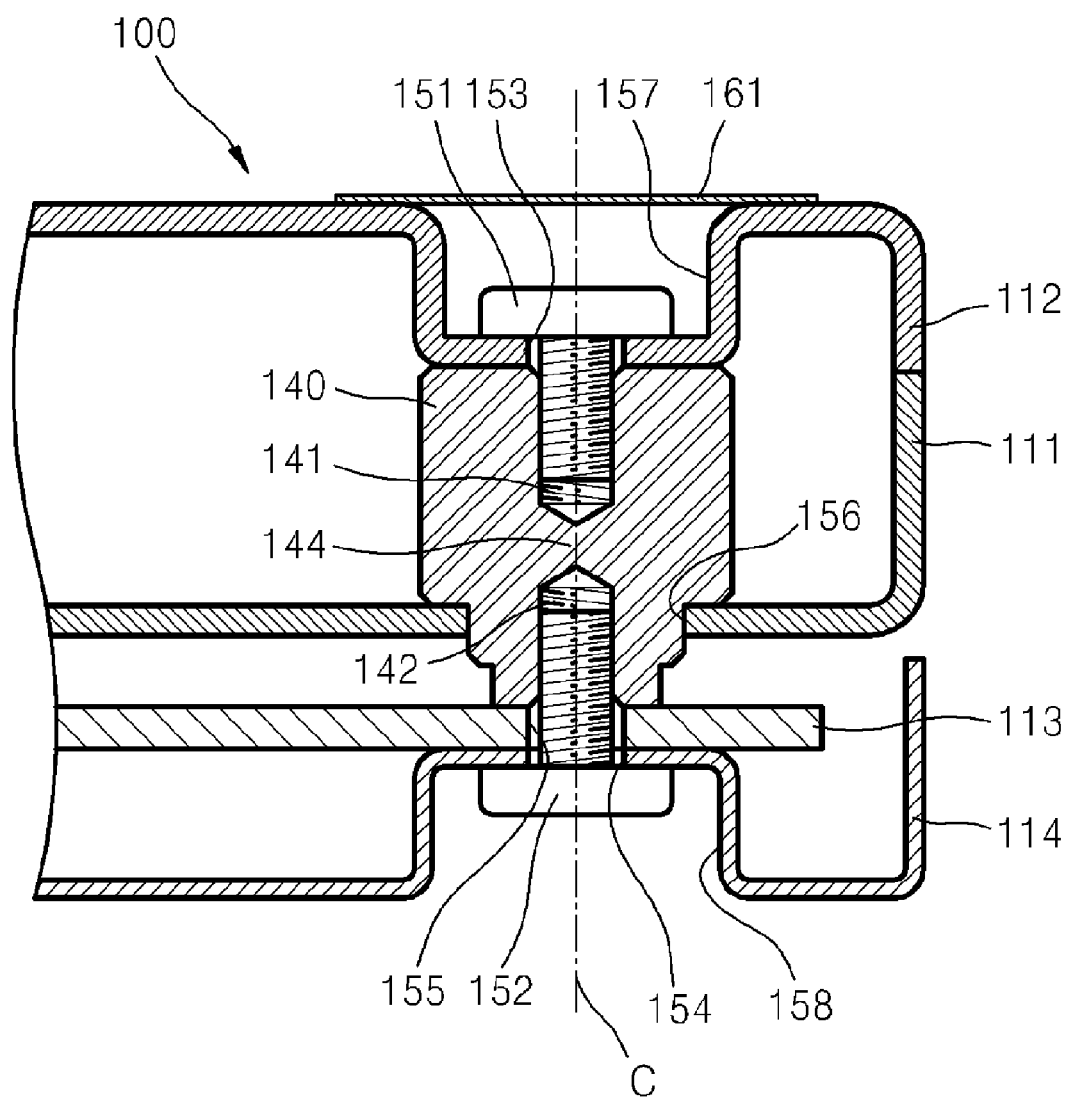
FIG. 3 is a cross-sectional view illustrating a coupling portion in the hard disk drive of FIG. 2, according to an embodiment of the present general inventive concept.

FIG. 2 is an exploded perspective view illustrating a coupling structure of a hard disk drive 100 according to an embodiment of the present general inventive concept. FIG. 3 is a cross-sectional view illustrating a coupling portion in the hard disk drive 100 of FIG. 2, according to an embodiment of the present general inventive concept.

Referring to FIGS. 2 and 3, the hard disk drive 100 includes a spindle motor 120, a disk 122 mounted on the spindle motor 120 to rotate, and an actuator 130 moving a read/write head to record and reproduce data to and from a predetermined position. The actuator 130 includes a swing arm 132 rotatably coupled to an actuator pivot 131, a suspension assembly 133 mounted on an end portion of the swing arm 132, and a voice coil motor (VCM) 134 to rotate the swing arm 132. The suspension assembly 133 supports a slider where the read/write head is mounted such that the slider is elastically biased with respect to a surface of the disk 122.

The VCM 134 is controlled by a servo control system and rotates the swing arm 132 of the actuator 130 in a direction according to Fleming's left hand rule by the interaction of a current applied to a VCM coil and a magnetic field formed by a magnet. That is, when power of the hard disk drive 100 is turned on and the disk 122 rotates, the VCM 134 rotates the swing arm 132 in a counterclockwise direction to move the read/write head over a recording surface of the disk 122. On the other hand, when power of the hard disk drive 100 is turned off and the disk 122 stops rotating, the VCM 134 rotates the swing arm 132 in a clockwise direction to move the read/write head out of the circumference of the disk 122. The read/write head having moved out of the circumference area of the recording surface of the disk 122 is parked in a parking ramp 135 disposed outside of the circumference of the disk 122.

The spindle motor 120 and the actuator 130 are mounted on a base plate 111, and a cover plate 112 is coupled to an upper portion of the base plate 111 to cover the disk 122, the actuator 130, and the like. A PCB 113 is coupled to a lower portion of the base plate 111 to operate the hard disk drive 100. The PCB 113 may be protected by a protective cover 114.

The base plate 111 and the cover plate 112 may be fabricated using a metal plate, for example, by pressing a stainless steel plate. A plurality of reinforcing grooves 116 may be formed in a concentric shape on the cover plate 112 in order to increase the rigidity thereof. The protective cover 114 may be also fabricated using a metal plate, for example, by pressing a stainless steel plate.

In the present embodiment, as illustrated in FIG. 2, three or four studs 140 are used in order to couple the cover plate 112 and the PCB 113 to the base plate 111. The protective cover 114 may be also coupled to the base plate 111 using the studs 140. The three or four studs 140 can be disposed at an edge portion of the base plate 111. The studs 140 may be fabricated using metal, for example, stainless steel.

Each of the studs 140 is inserted into a stud insertion hole 156 penetrating the base plate 111 to be fixed to the base plate 111, thus preventing leakage through the stud insertion hole 156. A first screw coupling hole 141 is formed to a predetermined depth on an upper surface of the stud 140, and a second screw coupling hole 142 is formed to a predetermined depth on a lower surface of the stud 140. Centerlines of the first and second screw coupling holes 141 and 142 correspond to a centerline C of the stud 140. A partition 144 may be formed between the first and second screw coupling holes 141 and 142 to prevent leakage through the first and second screw coupling holes 141 and 142.

A first screw insert hole 153 into which the first screw 151 is inserted is formed at a position of the cover plate 112 corresponding to the stud 140. When the cover plate 112 is disposed on the base plate 111 and the first screw 151 is inserted into the first screw insert hole 153 and coupled to the first screw coupling hole 141 formed in the stud 140, the cover plate 112 is firmly coupled to the base plate 111 in the state where an inner surface of the cover plate 112 around the first screw insert hole 153 is in contact with an upper surface of the stud 140.

A first recess 157 may be formed around the first screw insert hole 153 of the cover plate 112, and a head portion of the first screw 151 may be inserted into the first recess 157. In this case, the head portion of the first screw 151 does not protrude out beyond an outer surface of the cover plate 112. A sealing tape 161 may be attached to the outer surface of the cover plate 112 so as to cover the first recess 157, thereby preventing leakage through the first screw insert hole 153.

A second screw insert hole 155 into which the second screw 152 is inserted is formed at a position of the PCB 113 corresponding to the stud 140. When the PCB 113 is disposed under the base plate 111, and the second screw 152 is inserted into the second screw insert hole 155 and coupled to the second screw coupling hole 142 formed in the stud 140, the PCB 113 is firmly coupled to the bask plate 111 in the state where a portion around the second screw insert hole 155 of the PCB 113 is in contact with a lower surface of the stud 140. Here, a lower portion of the stud 140 protrudes to a predetermined height under and through the base plate 111, and thus an interval between the base plate 111 and the PCB 113 is maintained by the protruding height.

As described above, the protective cover 114 may be coupled to the base plate 111 so as to cover and protect the PCB 113. A second screw insert hole 154 into which the second screw 152 is inserted is formed at a position of the protective cover 114 corresponding to the stud 140. When the PCB 113 and the protective 114 are disposed under the base plate 111, and the second screw 152 is inserted into the second screw insert holes 154 and 155 respectively formed in the protective cover 114 and the PCB 113 to be coupled to the second screw coupling hole 142, the protective cover 114 as well as the PCB 113 can be firmly coupled to the base plate 111. A second recess 158 may be formed around the second screw insert hole 154 of the protective cover 114, and a head portion of the second screw 152 may be inserted into the second recess 158. In this case, the head portion of the second screw 152 does not protrude out beyond an outer surface of the protective cover 114.

As described above, according to the coupling structure of the hard disk drive 100 of the present general inventive concept, since the screw coupling holes 141 and 142 are formed in upper and lower portions of the stud 140, respectively, the cover plate 112 and the PCB 113 can be coupled to the base plate 111 using only the one stud 140. Therefore, the number of the studs 140 used to couple the hard disk drive 100 is reduced to half of the conventional structure. In addition, since the one stud 140 is mounted at each coupling position of the base plate 111, a mounting space of the stud 140 decreases, thus allowing for fabricating of more compact-sized hard disk drives.

According to a coupling structure of a hard disk drive of the present general inventive concept, since a cover plate and a PCB can be coupled to respective coupling positions of a base plate using only one stud, the number of studs used to couple the hard disk drive is reduced to half of the conventional structure, thereby decreasing fabrication costs. In addition, since only the one stud is mounted in each coupling position of the base plate, a mounting space for studs can be decreased.

While the present general inventive concept has been particularly shown and described with reference to exemplary embodiments thereof, it will be understood by those of ordinary skill in the art that various changes in form and details may be made therein without departing from the spirit and scope of the present general inventive concept as defined by the following claims.

What is claimed is:

1. A coupling structure of a hard disk comprising:
   a stud insertion hole formed in a base plate;
   a stud including a first coupling hole formed in an upper portion and a second coupling hole formed in a lower portion, the stud being inserted into the stud insertion hole;
   a first insert hole formed at a position of a cover plate disposed over the base plate corresponding to the stud, wherein
   the first insert hole is coupled to the first coupling hole so that the cover plate is coupled to the base plate; and
   a second insert hole formed at a position of a printed circuit board (PCB) disposed under the base plate corresponding to the stud, wherein
   the second hole is coupled to the second coupling hole so that the PCB is coupled to the base plate.

2. The coupling structure of claim 1, wherein centerlines of the first screw coupling hole and the second coupling hole correspond to a centerline of the stud.

3. The coupling structure of claim 1, wherein a partition is formed between the first and second screw coupling holes.

4. The coupling structure of claim 1, wherein a first recess is formed around the first screw insert hole of the cover plate, and a head portion of the of a first screw is inserted into the first recess.

5. The coupling structure of claim 4, wherein a sealing tape is formed on an outer surface of the cover plate so as to cover the first recess.

6. The coupling structure of claim 1, wherein a protective cover is disposed under the base plate to cover and protect the PCB,
   a second insert hole is formed at a position of the protective cover corresponding to the stud, and
   a second screw is inserted into the second insert hole formed in the protective cover and the second insert hole formed in the PCB to be coupled to the second coupling hole of the stud so that the protective cover and the PCB are coupled together to the base plate.

7. The coupling structure of claim 6, wherein a second recess is formed around the second insert hole of the protective cover and a head portion of the second screw is inserted into the second recess.

8. The coupling structure of claim 1, wherein the stud is formed of stainless steel.

9. A coupling structure of a hard disk drive comprising:
   a cover plate including at least one first recession having a first insertion hole;
   a base plate including at least one stud insertion hole;
   a stud including a first coupling hole formed in an upper portion to align with the first insertion hole and a second coupling hole formed in a stepped lower portion thereof to align with and partially extend through the stud insertion hole to be fastened to the base plate; and
   a printed circuit board (PCB) disposed below the base plate and having a second insertion hole to align with the first insertion hole and the stud insertion hole, wherein the first insertion hole and the second insertion hole are operable to align along a same axis.

10. The apparatus of claim 9, further comprising:
    a protective cover to extend along a length of an outer side of the PCB to protect the PCB, the protective cover including a second recession having a third insertion hole formed therein to receive a second screw before the second insertion hole receives the second screw such that the second screw secures both the PCB and the protective cover to the stepped lower portion of the stud.

11. The coupling structure of claim 10, wherein the first and second recessions are formed to a depth such that first and second screws inserted therein, respectively, remain below the surface of the cover plate and the protective cover, respectively.

12. The coupling structure of claim 10, wherein the first insertion hole, the stud insertion hole and the second insertion hole have a common central axis.

13. The coupling structure of claim 10, wherein the first insertion hole and the second insertion hole have a common axis and are separated from each other by a partition portion of the stud.

14. A coupling structure of a hard disk comprising:
- a first side including a first insertion hole to fasten a cover plate to the stud; and
- a second side opposite the first side, the second side including:
  - a stepped portion to be frictionally inserted into a base plate of the storage device to connect the cover plate to the base plate, and
  - a second insertion hole to fasten a printed circuit board to the stud and adjacent to the base plate.

15. The coupling structure of claim 14, wherein the second insertion hole is formed along a same common axis with the first insertion hole.

16. The coupling structure of claim 15, further comprising:
- a partition portion disposed between the first insertion hole and the second insertion hole.

* * * * *